United States Patent
Denul et al.

(10) Patent No.: US 7,927,700 B2
(45) Date of Patent: Apr. 19, 2011

(54) SUBSTRATE COVERED WITH AN INTERMEDIATE COATING AND A HARD CARBON COATING

(75) Inventors: Jurgen Denul, Deinze (BE); Erik Dekempeneer, Oostmalle (BE); Wilmert De Bosscher, Drongen (BE)

(73) Assignee: NV Bekaert SA, Zwevegem (BE)

(*) Notice: Subject to any disclaimer, the term of this patent is extended or adjusted under 35 U.S.C. 154(b) by 519 days.

(21) Appl. No.: 10/565,265

(22) PCT Filed: Jul. 1, 2004

(86) PCT No.: PCT/EP2004/051320
§ 371 (c)(1), (2), (4) Date: Jan. 25, 2006

(87) PCT Pub. No.: WO2005/014882
PCT Pub. Date: Feb. 17, 2005

(65) Prior Publication Data
US 2006/0182895 A1    Aug. 17, 2006

(30) Foreign Application Priority Data
Jul. 25, 2003    (EP) .................................... 03102294

(51) Int. Cl.
*B32B 9/00* (2006.01)
(52) U.S. Cl. ...................................................... 428/408
(58) Field of Classification Search .................. 428/408, 428/698; 427/249.7
See application file for complete search history.

(56) References Cited

U.S. PATENT DOCUMENTS

| | | | |
|---|---|---|---|
| 6,033,533 A | 3/2000 | Sugiyama et al. | |
| 6,126,793 A | 10/2000 | Sugiyama et al. | |
| 6,740,393 B1 | 5/2004 | Massler et al. | |
| 7,067,191 B2 * | 6/2006 | Derflinger et al. | 428/408 |
| 2004/0038033 A1 | 2/2004 | Massler et al. | |
| 2004/0219294 A1 | 11/2004 | Massler et al. | |
| 2005/0003241 A1 * | 1/2005 | Derflinger et al. | 428/698 |

FOREIGN PATENT DOCUMENTS

| DE | 100 18 143 A1 | 10/2001 |
|---|---|---|
| FR | 2 596 775 A1 | 10/1987 |

OTHER PUBLICATIONS

Yang, Elsevier, Materials Letters (2003) 3305-3310.*
R. F. Huang et al., "Wear-resistant multilayered diamond-like carbon coating prepared by pulse biased arc ion plating," Diamond and Related Materials, vol. 10, No. 9-10, Sep. 2001, pp. 1850-1854.
J. Deng et al., "DLC multilayer coatings for wear protection," Diamond and Related Materials, vol. 4, No. 7, May 15, 1995, pp. 936-943.
A. A. Voevodin et al., "Design of a Ti/TiC/DLC functionally gradient coating based on studies of structural transitions in Ti-C thin films," Thin Solid Films, vol. 298, No. 1-2, Apr. 20, 1997, pp. 107-115.

* cited by examiner

*Primary Examiner* — Angela Ortiz
*Assistant Examiner* — Daniel Miller
(74) *Attorney, Agent, or Firm* — Foley & Lardner LLP

(57) ABSTRACT

The invention relates to a substrate covered at least partially with a layered coating. The layered coating comprises an intermediate coating and a hard carbon coating. The intermediate coating comprises a first metal layer deposited on the substrate, the first metal layer comprising at least one element of group IVB, group VB or group VIB; a nitride layer deposited on the first metal layer, the nitride layer comprising at least one nitride of an element of group IVB, group VB or group VIB; a second metal layer deposited on the nitride layer, the second metal layer comprising at least one element of group IVB, group VB or group VIB; a transition layer deposited on the second metal layer, the transition layer comprising at least one carbide of an element of group IVB, group VB or group VIB.

14 Claims, No Drawings

SUBSTRATE COVERED WITH AN INTERMEDIATE COATING AND A HARD CARBON COATING

FIELD OF THE INVENTION

The invention relates to a substrate covered at least partially with an Intermediate coating and a hard carbon coating.

BACKGROUND OF THE INVENTION

Hard carbon coatings such as diamond-like carbon (DLC) coatings are attractive coatings for example because of their high hardness and low coefficient of friction, their chemical inertness and their biocompatibility. One of the main problems of DLC coatings is the poor adhesion to a substrate.

It has been found that the application of one or more intermediate layers between the DLC coating and the substrate can promote the adhesion strength. A variety of interlayers have been tested, such as an interlayer of Ti, TiN or TiC.

FR 2 596 775 describes the use of a TiN—TiCN intermediate layer. However, adhesion of DLC coatings to the substrate is still an issue.

SUMMARY OF THE INVENTION

It is an object of the invention to provide a coating having an improved adhesion to a substrate.

According to a first aspect of the present invention a substrate covered at least partially with a layered coating is provided.

The layered coating comprises an intermediate coating and a hard carbon coating. The intermediate coating comprises:
  a first metal layer deposited on the substrate, the first metal layer comprising at least one element of group IVB, group VB or group VIB;
  a nitride layer deposited on the first metal layer, the nitride layer comprising at least one nitride of an element of group IVB, group VB or group VIB;
  a second metal layer deposited on the nitride layer, the second metal layer comprising at least one element of group IVB, group VB or group VIB;
  a transition layer deposited on the second metal layer, the transition layer comprising at least one carbide of an element of group IVB, group VB or group VIB.

The first and the second metal layers are adhesion promoting layers:
  The first metal layer, i.e. the layer situated between the substrate and the nitride layer, is promoting the adhesion of the nitride to the substrate.
  The second metal layer, i.e. the layer situated between the nitride and the carbide layer, is promoting the adhesion of the carbide layer to the nitride layer.

The hard carbon coating may comprise any carbon-based coating known in the art.

Preferably, the hard carbon coating comprises a diamond-like coating. Diamond-like coatings are amorphous carbon based coatings with a high hardness and a low coefficient of friction. Their unique composition and structure result in excellent wear resistance and non-sticking characteristics.

Diamond-like coatings comprise for example diamond-like carbon (DLC) coatings and diamond-like nanocomposite (DLN) coatings or layered structures of diamond-like carbon (DLC) and diamond-like nanocomposite (DLN) coatings.

Diamond-like carbon coatings comprise amorphous hydrogenated carbon coatings (a-C:H); whereas diamond-like nanocomposite coatings comprise interpenetrating networks of a-C:H and a-Si:O. A representative DLN coating comprises 30 to 70 at % of C, 20 to 40 at % of H, 5 to 15 at % of Si and 5 to 15 at % of O.

DLN coating exhibits a very low coefficient of friction, even in high humidity or wet environment.

The hard carbon coating such as the diamond-like coating may be deposited by any technique known in the art. A preferred technique comprises chemical vapor deposition (CVD), such as plasma assisted chemical vapor deposition (PACVD).

To influence its conductivity, the hard carbon coating such as the DLC or DLN coating can further be doped with a transition metal. In particular W, Zr, Ti, Nb and Ta are well suited as doping elements.

The DLC or DLN coating can further contain an inert gas such as Ne, Ar or Kr, for example in an amount of 0.5 to 5 at %.

The first metal layer and the second metal layer may comprise any element or combination of elements of group IVB, group VB or group VIB. In preferred embodiments the first and/or the second metal layer comprise Ti or Cr.

The first metal layer and the second metal layer preferably have a thickness ranging between 0.001 and 1 µm, for example between 0.001 and 0.1 µm, such as 0.05 µm.

The nitride layer may comprises at least one nitride of an element of group IVB, group VB or group VIB. In a preferred embodiment, the nitride layer comprises TiN or CrN.

The nitride layer is giving the layered coating in combination with the hard carbon coating the required mechanical properties.

The thickness of the nitride layer is preferably between 0 and 5 µm. More preferably, the nitride layer has a thickness between 0.001 and 1 µm, for example 0.75 or 1 µm.

The transition layer deposited on the second metal layer comprises at least one carbide of an element of group IVB, group VB or group VIB. The transition layer comprises preferably $Ti_xC_y$ or $Cr_xC_y$. The transition layer comprises for example stoichiometric TiC or $Cr_2C_3$. However, the transition layer may also comprise non-stoichiometric $Ti_xC_y$ or $Cr_xC_y$. Preferably, the transition layer shows a gradient, whereby the carbon content is increasing and the metal content is decreasing from the side of the transition layer in contact with the second metal layer towards the side of the transition layer in contact with the hard carbon coating.

The thickness of the carbide layer is preferably between 0.001 and 1 µm, for example 0.1 µm.

The layered coating according to the present advantage combines the characteristics of having a good adhesion to the substrate and having a high hardness.

The adhesion of the layered coating according to the invention, expressed by means of the Rockwell C indentation test is better than HF2 and more preferably equal to HF1 (VDI 3198 norm).

The critical load to obtain delamination in a scratch test (European Standard suggestion prEN 1071-3) is higher than 35 N and more preferably higher than 50 N.

The hardness of the layered coating according to the invention is higher than 10 GPa. In a preferred embodiment a hardness of at least 20 GPa has been reached. The hardness can be influenced by the choice of the top layer of the layered coating.

The substrate to be coated may comprise any substrate, either flexible or rigid. Examples of substrates comprise steel substrates, hard metal cermets, silicon substrates, aluminium or aluminium alloy substrates, titanium or titanium alloy substrates, copper or copper alloy substrates, ceramics or glass substrates.

The layered coating according to the present invention can be used in a great number of applications. The composition of the DLC coating can be adjusted specifically to meet preset requirements such as low friction, high hardness, high abrasion and wear resistance, high corrosion resistance and non-sticking properties.

The layered coating according to the present invention can for example be used to coat all kinds of mouldings means, medical implants, automotive powertrain components, textile components, . . . .

DESCRIPTION OF THE PREFERRED EMBODIMENTS OF THE INVENTION

To evaluate the influence of the first metal layer, two samples are compared.

In a first sample a TiN layer is deposited directly on the substrate; in a second sample a Ti layer (0.010 μm) is deposited on the substrate and a TiN layer is deposited on the Ti layer.

In the first sample, the TiN layer delaminates immediately after removal from the substrate holder. Delamination was most dramatic at the edges of the sample. At these edges the ion bombardment during growth is more intense due to edge field effects. This can result in higher stresses in the coating which can cause the coating to delaminate more easily. Both indentation test (HF6) and scratch test (critical load=16 N) confirm the poor adhesion.

The second sample shows good adhesion, confirmed both by the indentation test (HF1) and the scratch test (critical load>30 N). In one embodiment a scratch test showed a critical load higher than 47 N.

In order to check the need of a transition layer before the deposition of a hard carbon layer, such as a DLC layer, DLC was deposited directly on the TiN layer (0.01 μm Ti/0.6 μm TiN/1.3 μm DLC).

Delamination of the DLC from the TiN could be observed. This poor adhesion was confirmed by a very bad indentation result and a low critical load value (28 N) in the scratch tests.

This result proves that the transition between the TiN and the DLC coating is critical and that a kind of transition layer is necessary. Three different samples were compared:
1) a layered coating comprising
   0.1 μm Ti/0.6 μm TiN/0.6 μm TiC/11.3 μm DLC;
2) a layered coating comprising
   0.1 μm Ti/0.6 μm TiN/0.3 μm TiNC/1.3 μm DLC;
3) a layered coating comprising
   0.01 μm Ti/0.75 μm TiN/0.01 μm Ti/0.1 μm TiC/1.3 μm DLC.

The first and second sample show a poor adhesion, whereas the third sample shows a good adhesion. The good adhesion of the third sample is confirmed by indentation tests (HF1) and scratch test (critical load>40 N)

In another example the layered coating comprises an intermediate coating comprising:
a first Cr layer;
a CrN layer;
a second Cr layer:
a $Cr_xC_y$ layer, such as a $Cr_3C_2$ layer.

The invention claimed is:
1. A substrate covered at least partially with a layered coating, said layered coating comprising:
an intermediate coating and a hard carbon coating,
said intermediate coating comprising:
a first metal layer deposited on the substrate, said first metal layer consisting of Ti;
a nitride layer deposited on said first metal layer, said nitride layer consisting of TiN;
a second metal layer deposited on said nitride layer, said second metal layer consisting of Ti;
a transition layer deposited on said second metal layer, said transition layer consisting of $Ti_xC_y$,
wherein said hard carbon coating comprises a diamond-like nanocomposite (DLN) coating.

2. A substrate according to claim 1, wherein said hard carbon coating comprises a layered structure of diamond-like carbon (DLC) and diamond-like nanocomposite (DLN) coatings.

3. A substrate according to claim 1, wherein said hard carbon coating is doped with a transition metal and/or with an inert gas.

4. A substrate according to claim 1, wherein said first metal layer and said second metal layer have a thickness between 0.001 and 1 μm.

5. A substrate according to claim 1, wherein said nitride layer has a thickness between 0 and 5 μm.

6. A substrate according to claim 1, wherein said transition layer has a thickness between 0.001 and 1 μm.

7. A substrate according to claim 1, wherein the adhesion of said layered coating expressed by means of the Rockwell C test is better than HF2.

8. A substrate according to claim 1, wherein the adhesion of said layered coating expressed by means of the critical load to obtain delamination is higher than 35 N.

9. A substrate according to claim 1, wherein said layered coating has a hardness of at least 10 GPa.

10. A substrate according to claim 1, wherein the diamond-like nanocomposite coating comprises interpenetrating networks of a-C:H and a-Si:O.

11. A substrate according to claim 1, wherein the DLN coating comprises an inert gas in an amount of 0.5 to 5 at %.

12. A substrate according to claim 11, wherein the inert gas is Ne, Ar, or Kr.

13. A substrate according to claim 1, wherein said hard carbon coating is deposited directly onto the transition layer.

14. A substrate covered at least partially with a layered coating, said layered coating comprising:
an intermediate coating and a hard carbon coating,
said intermediate coating comprising:
a first metal layer deposited on the substrate, said first metal layer comprising at least one element of group IVB, group VB or group VIB;
a nitride layer deposited on said first metal layer, said nitride layer comprising at least one nitride of an element of group IVB, group VB or group VIB;
a second metal layer deposited on said nitride layer, said second metal layer comprising at least one element of group IVB, group VB or group VIB;
a transition layer deposited on said second metal layer, said transition layer consisting of at least one carbide of an element of group IVB, group VB or group VIB,
wherein said hard carbon coating comprises a diamond-like nanocomposite (DLN) coating,
wherein said hard carbon coating is deposited directly onto the transition layer,
wherein the diamond-like nanocomposite coating comprises 30-70 at % C, 20-40 at % H, 5-15 at % Si, and 5-15 at % O.

\* \* \* \* \*